(12) United States Patent
Chen et al.

(10) Patent No.: US 7,768,367 B2
(45) Date of Patent: Aug. 3, 2010

(54) CIRCULAR MAGNETIC SWITCH

(75) Inventors: Chia-Li Chen, Zhong-He (TW);
Jui-Huang Tseng, Zhong-He (TW)

(73) Assignee: DOSUN Solar Technology Co., Ltd.,
Zhong-He, Taipei County (TW)

( * ) Notice: Subject to any disclaimer, the term of this patent is extended or adjusted under 35 U.S.C. 154(b) by 229 days.

(21) Appl. No.: 12/071,754

(22) Filed: Feb. 26, 2008

(65) Prior Publication Data

US 2009/0212892 A1 Aug. 27, 2009

(51) Int. Cl.
*H01H 9/00* (2006.01)
(52) U.S. Cl. .................. 335/205; 335/207; 200/561
(58) Field of Classification Search ......... 335/205–207; 324/207.2, 207.21, 205.75, 207.25; 20/561, 20/564, 567
See application file for complete search history.

(56) References Cited

U.S. PATENT DOCUMENTS 3,651,438 A * 3/1972 Hayashi et al. ............. 335/207
4,054,860 A * 10/1977 Henderson et al. ........ 338/32 H
7,126,072 B2 * 10/2006 Saitoh ........................ 200/512
7,439,825 B2 * 10/2008 Nam et al. .................. 333/191
7,609,138 B2 * 10/2009 Dietrich et al. ............. 335/205
2008/0284549 A1 * 11/2008 Bedell ........................ 335/170

* cited by examiner

*Primary Examiner*—Elvin G Enad
*Assistant Examiner*—Bernard Rojas
(74) *Attorney, Agent, or Firm*—Jackson IPG PLLC

(57) ABSTRACT

A circular magnetic switch comprises a circuit device and a ring. The circuit device is provided with a plurality of magnetic induction elements and the ring is provided with a plurality of circularly arranged magnets, so that the magnetic induction elements are able to sense the relatively positional changes of the magnets when the ring is turned. The circular magnetic switch is characterized in that: at least an anti-interference magnet is further provided between at least two magnets of the plurality of magnets and the polarity of two magnets is opposite to that of the anti-inference magnets that is provided between the two magnets.

3 Claims, 3 Drawing Sheets

CIRCULAR MAGNETIC SWITCH

BACKGROUND OF THE INVENTION

1. Field of the Invention

The present invention relates to a magnetic switch and, more particularly, to a circular magnetic switch that is provided with at least an anti-interference magnets between two magnets to avoid the interference generated from other magnets toward the magnetic induction element, and is suitable for portable lighting devices such as flashlights.

2. Description of the Prior Art

With respect to multifunctional portable lighting devices such as a flashlight, it is difficult to design the lighting devices where all setting and operations can be controlled by one key because of size, appearance, and waterproofing problems. Even though the design of multiple keys is applied, it is necessary to add many extra waterproof structures. Besides, some lighting devices are designed to have multiple keys controlled by pressing the keys at intervals and in sequence to perform different functions. It is difficult for users to definitely ascertain the instant status and to enter the desired mode directly.

It is widely known in the field of multifunctional portable lighting devices to produce electric current that are equivalent to different functional keys by using both of magnetic induction elements and magnets. Conventionally, the magnetic induction elements are welded on a round circuit board whereon is fixed in a tube made of plastics, metal, or other waterproof material. The magnets corresponding to the magnetic induction elements are fixed on an internal rotating ring of a ring structure outside the tube. The ring structure can also be made of plastics, metal, or other waterproof material. When the magnets are moved by turning the ring structure, the relatively positional changes of the magnets can be sensed by the magnetic induction elements for performing following corresponding procedures.

By reason of the ring structure can be turned 360 degrees, the magnets can be rotated and positioned in a step-type way by an elastic piece. Therefore, through the movement of the magnets, different combination patterns of the magnetic induction elements can be produced and the produced combination patterns can be detected by the scanning of buttons that are equivalent to quick buttons functionally. Besides, by providing the ring structure with different images, users can operate desired functions and ascertain the function used currently in order to overcome the drawbacks mentioned above. However, in practice, the magnetic induction element needs to be disposed corresponding to the magnet and consequently magnetic hysteresis may be produced. The magnetic hysteresis caused by other magnets will result in the interference of the normal function of the magnetic induction element. In other words, the magnetic induction element that should not be actuated is actuated as a result of the magnetic hysteresis. This phenomenon is obvious in small portable lighting devices with many combination patterns. Therefore, how to apply a magnetic switch to a small portable lighting device with many combination patterns is a crucial problem needs to be solved for people in the art.

SUMMARY OF THE INVENTION

An object of the present invention is to provide a circular magnetic switch for preventing magnetic induction elements from magnetic interference.

In order to achieve the above object, the present invention provides a circular magnetic switch comprising a circuit device and a ring. The circuit device is provided with a plurality of magnetic induction elements and the ring is provided with a plurality of circularly arranged magnets, so that the magnetic induction elements are able to sense the relatively positional changes of the magnets when the ring is turned. The circular magnetic switch is characterized in that: at least an anti-interference magnet is further provided between at least two magnets of the plurality of magnets and the polarity of two magnets is opposite to that of the anti-inference magnet provided between the two magnets.

The following detailed description, given by way of examples or embodiments, will best be understood in conjunction with the accompanying drawings.

DETAILED DESCRIPTION OF THE PREFERRED EMBODIMENTS

Figure 1:
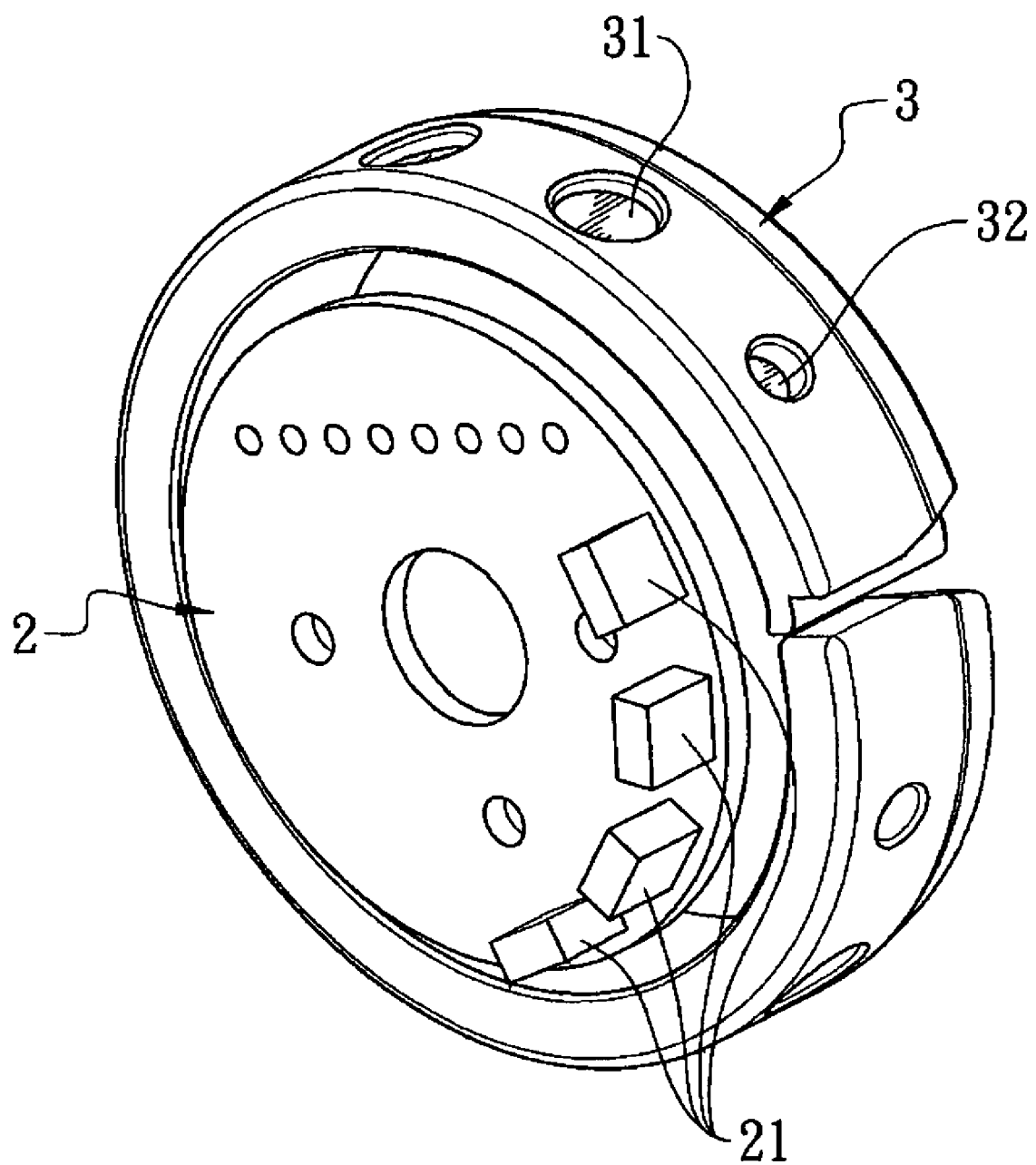
FIG. 1 is a perspective view of a preferred embodiment of a circular magnetic switch of the present invention.
Figure 2:
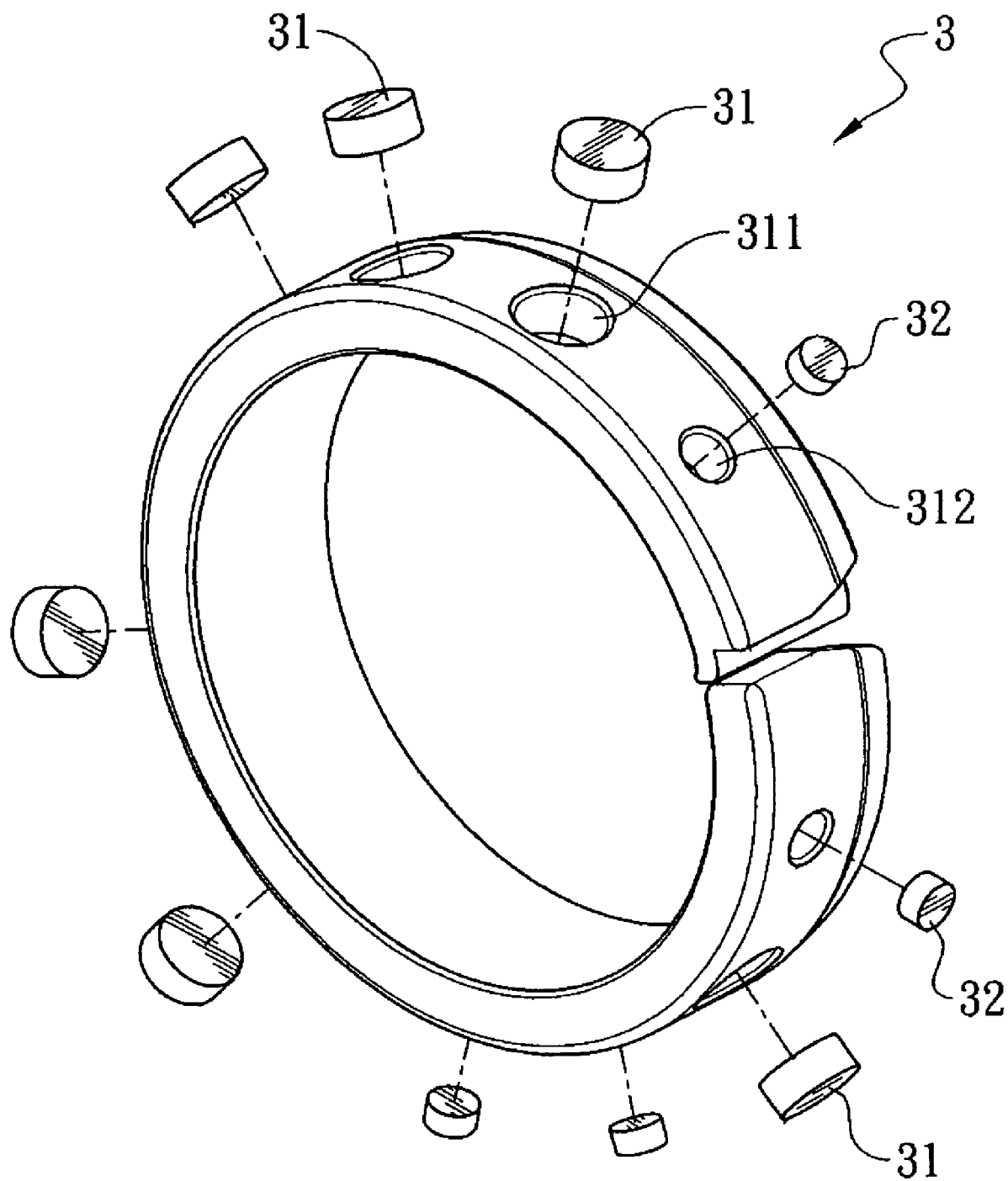
FIG. 2 is an exploded perspective view of a ring in the preferred embodiment of the circular magnetic switch of the present invention.
Figure 3:
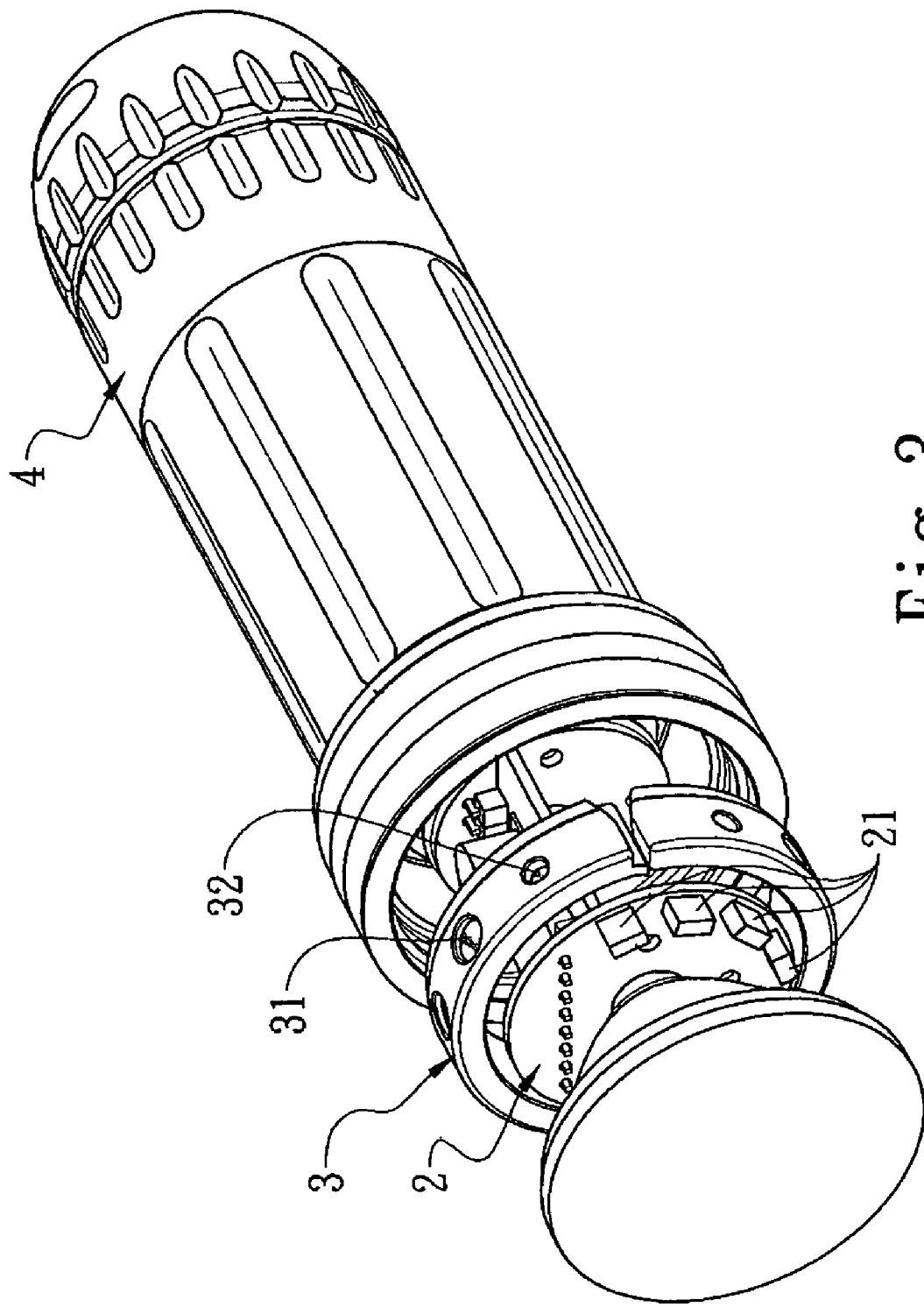
FIG. 3 is a schematic view showing that the circular magnetic switch of the present invention is connected to a flashlight.

FIGS. 1-3 shows a preferred embodiment of a circular magnetic switch 1 according to the present invention. The circular magnetic switch 1 comprises a circuit device 2 and a ring 3.

The circuit device 2 is provided with a plurality of magnetic induction elements 21 and the ring 3 is provided with a plurality of circularly arranged magnets 31. When the ring 3 is turned, the positions of the magnets 31 will be changed accordingly and the magnetic induction elements 21 are able to sense the relatively positional changes of the magnets 31. Besides, an anti-interference magnet 32 is provided between at least two of the plural magnets 31 on the ring 3. The polarity of the two magnets 31 is opposite to the anti-interference magnet 32 which is provided between the two magnets 31. Moreover, the ring 3 is provided with a plurality of holes 311, 312 for disposing the magnets 31 and the anti-interference magnets 32.

When the present invention is in practice, for example, used in a flashlight 4, the number of the anti-interference magnets 32 is determined according to the size of the flashlight 4 and the desired number of steps for controlling the switch. In this embodiment, the present invention is provided with a plurality of anti-interference magnets 32. The polarity of the anti-interference magnets 32 is opposite to that of the two magnets 31 provided at two sides of the anti-interference magnet 32. At least one anti-interference magnet 32 is disposed between any two neighboring magnets 31 and, if necessary, the two magnets 31 can be provided with plural anti-interference magnets 32 there between.

Accordingly, the magnetic interference form the magnetic lines of the magnets 31 toward the magnetic induction element 21 can be reduced when the magnetic induction element 21 is actuated because at least one side of the magnet 31 corresponding to the magnetic induction element 21 is provided with the anti-interference magnet 32 with opposite polarity compared with the magnet 31. Consequently, the magnetic induction element 21 can work normally. Therefore, the conventional problem, that is, the magnetic induction element that should not be actuated is actuated as a result of the magnetic hysteresis, can be solved.

Moreover, the anti-interference effect can be enhanced by some modifications. For example, let the magnetic force of each anti-interference magnet 32 be weaker than that of the two magnets 31 provided at two sides of the anti-interference magnet 32 or let the anti-interference magnet 32 and the magnet 31 be cylindrical and the surface area of the anti-interference magnet 32 be smaller than that of the magnet 31.

Accordingly, as disclosed in the above description and attached drawings, the present invention can provide a circular magnetic switch. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A circular magnetic switch, comprising a circuit device and a ring, where the circuit device is provided with a plurality of magnetic induction elements and the ring is provided with a plurality of circularly arranged magnets, so that the magnetic induction elements are able to sense the relatively positional changes of the magnets when the ring is turned, and the circular magnetic switch is characterized in that:

at least an anti-interference magnet is further provided between at least two magnets of the plurality of magnets and the polarity of two magnets is opposite to that of the anti-inference magnet provided between the two magnets, wherein the number of the anti-interference magnets is at least two; and wherein the magnetic force of each anti-interference magnet is weaker than that of the two magnets provided at two sides of the anti-interference magnet.

2. The circular magnetic switch as claimed in claim 1, wherein the anti-interference magnet is provided between each two magnets.

3. The circular magnetic switch as claimed in claim 1, wherein the anti-interference magnet and the magnet are cylindrical and a surface area of the anti-interference magnet is smaller than that of the magnet.

* * * * *